(12) United States Patent
Kelly et al.

(10) Patent No.: US 10,739,679 B2
(45) Date of Patent: *Aug. 11, 2020

(54) RUGGEDIZED SOLDER MASK MATERIAL

(71) Applicant: INTERNATIONAL BUSINESS MACHINES CORPORATION, Armonk, NY (US)

(72) Inventors: Matthew Kelly, Oakville (CA); Mark Jeanson, Rochester, MN (US); Joseph Kuczynski, North Port, FL (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/458,930

(22) Filed: Jul. 1, 2019

(65) Prior Publication Data

US 2019/0324369 A1 Oct. 24, 2019

Related U.S. Application Data

(63) Continuation of application No. 15/819,349, filed on Nov. 21, 2017.

(51) Int. Cl.
| | | |
|---|---|---|
| *G03F 7/032* | (2006.01) | |
| *G03F 7/028* | (2006.01) | |
| *G03F 7/038* | (2006.01) | |
| *G03F 7/027* | (2006.01) | |
| *B23K 35/22* | (2006.01) | |
| *G03F 7/039* | (2006.01) | |
| *H01L 21/48* | (2006.01) | |
| *G03F 7/004* | (2006.01) | |
| *B23K 35/02* | (2006.01) | |
| *B23K 35/36* | (2006.01) | |
| *G03F 7/26* | (2006.01) | |

(52) U.S. Cl.
CPC .......... *G03F 7/032* (2013.01); *B23K 35/0244* (2013.01); *B23K 35/224* (2013.01); *B23K 35/3613* (2013.01); *G03F 7/0047* (2013.01); *G03F 7/027* (2013.01); *G03F 7/028* (2013.01); *G03F 7/038* (2013.01); *G03F 7/039* (2013.01); *G03F 7/26* (2013.01); *H01L 21/4867* (2013.01)

(58) Field of Classification Search
CPC .......... G03F 7/027; G03F 7/028; G03F 7/032; G03F 7/26
USPC .......................................... 430/270.1, 281.1
See application file for complete search history.

(56) References Cited

U.S. PATENT DOCUMENTS

| | | | |
|---|---|---|---|
| 4,120,843 A | 10/1978 | Ameen et al. | |
| 6,682,872 B2 | 1/2004 | Sachdev et al. | |
| 6,783,589 B2 | 8/2004 | Dahl et al. | |
| 7,146,720 B2 | 12/2006 | Rumsey et al. | |
| 7,282,272 B2 | 10/2007 | Jones et al. | |
| 7,304,190 B2 | 12/2007 | Liu et al. | |
| 7,488,565 B2 | 2/2009 | Liu et al. | |
| 7,553,605 B2* | 6/2009 | Hayata | B41C 1/1066 430/270.1 |
| 7,910,836 B2 | 3/2011 | Zhong et al. | |
| 2005/0074690 A1 | 4/2005 | Liu et al. | |
| 2006/0057496 A1 | 3/2006 | Liu et al. | |
| 2006/0063107 A1 | 3/2006 | Liu et al. | |
| 2008/0292987 A1 | 11/2008 | Houlihan et al. | |
| 2009/0075203 A1 | 3/2009 | Liu et al. | |
| 2009/0099326 A1* | 4/2009 | Okada | C07C 31/44 526/242 |
| 2009/0099330 A1* | 4/2009 | Okada | C08F 222/1006 528/98 |
| 2009/0137774 A1* | 5/2009 | Ito | C07D 301/30 528/405 |
| 2009/0163615 A1 | 6/2009 | Halahmi et al. | |
| 2010/0130712 A1* | 5/2010 | Ito | C07D 303/12 526/266 |
| 2010/0222525 A1* | 9/2010 | Ichiryu | C08G 59/306 525/476 |
| 2010/0267919 A1* | 10/2010 | Ichiryu | C07F 7/0874 528/25 |
| 2011/0252711 A1 | 10/2011 | Chakraborty et al. | |
| 2012/0251956 A1 | 10/2012 | Rahman et al. | |
| 2013/0102734 A1* | 4/2013 | Takaragi | C08F 210/02 525/106 |
| 2014/0030527 A1 | 1/2014 | Loget et al. | |
| 2015/0309410 A1 | 10/2015 | Rahman et al. | |
| 2016/0185595 A1 | 6/2016 | Chen et al. | |
| 2017/0260370 A1 | 9/2017 | Czaplewski et al. | |
| 2019/0155154 A1 | 5/2019 | Kelly et al. | |

OTHER PUBLICATIONS

Dahl, J.E., Liu, W.T., Carlson, R.M.K., "Isolation and Structure of Higher Diamondoids, Nanometer-Sized Diamond Molecules", Science, vol. 299, Issue 5603, 2003 pp. 96-99. science.sciencemag.org/content/299/5603/96/tab-pdf (Year: 2003).*

Dahl, J.E.P., et al., "Isolation and Structural Proof of the Large Diamond Molecule, Cyclohexamantane (C26H30)". Angewandte Chemie International Edition. 2003, vol. 42, pp. 2040-2044.

Dahl, J.E.,e t al., "Isolation and Structure of Higher Diamondoids, Nanometer-Sized Diamond Molecules". Science, vol. 299 (5603), pp. 96-99.

List of IBM Patents or Applications Treated as Related, Jul. 1, 2019, 2 pgs.

"Photoinitiators for UV Curing"—Formulators' Guide for Coatings [retrieved on Nov. 10, 2017]. Retrieved from the Internet URL: <http://www.mufong.com.tw/ciba/ciba_guid/photo_uv_2.pdf>, 16 pgs.

(Continued)

*Primary Examiner* — John S Chu (74) *Attorney, Agent, or Firm* — Tihon Poltavets; Matthew M. Hulihan; Heslin Rothenberg Farley & Mesiti PC (57) ABSTRACT

Disclosed herein are solder mask formulations that include a liquid photo imagable solution and a solution of functionalized diamondoids. Also disclosed are semiconductor fabrication methods that include applying a described solder mask formulation to a semiconductor device.

20 Claims, 5 Drawing Sheets

(56) References Cited

OTHER PUBLICATIONS

"Safety Data Sheet", Taiyo America, [retrieved on Nov. 10, 2017]. Retrieved from the Internet URL: <http://taiyo-america.com/docs/files/2914/6316/4780/SDS_PSR-4000_LDI_US_Series_8-9-15_L.pdf>, Issuing Date May 24, 2015, Revision Date Aug. 9, 2015, Revision No. 2, 10 pgs.

ORGANOSILICASOL™, [retrieved on Nov. 10, 2017]. Retrieved from the Internet URL: <http://www.nissanchem-usa.com/products/organosilicasol/>, Nissan Chemical America Corporation, 3 pgs.

McDowall, J., "Fibrinogen" McDowall J., [retrieved on Nov. 10, 2017]. Retrieved from the Internet URL: <https://www.ebi.ac.uk/interpro/potm/2006_11/Page1.htm>, InterPro, Nov. 2006, 3 pgs.

Abstract of: Thapliyal, P.C., "Interpenetrating Polymer Networks" [retrieved on Nov. 10, 2017]. Retrieved from the Internet URL: <http://www.tandfonline.com/doi/abs/10.1163/092764410X490509?journalCode=tcoi20>, Journal—Composite Interfaces, 2010, vol. 17, Issue 2-3, pp. 85-89 (Pub. online: Apr. 2, 2012).

Chiamori, H.C., "Suspension of Nanoparticles in SU-8 and Characterization of Nanocomposite Polymers", [retrieved on Nov. 10, 2017]. Retrieved from the Internet URL: <https://arxiv.org/ftp/arxiv/papers/0708/0708.1822.pdf>, ENS'05 Paris, France, Dec. 14-16, 2005, 6 pgs.

Woolley, M., "Corrosives on a PCB: Finding the source", [retrieved on Nov. 10, 2017]. Retrieved from the Internet URL: <https://www.edn.com/design/pc-board/4422894/Corrosives-on-a-PCB--Finding-the-source>, EDN Network, Oct. 17, 2013, 7 pgs.

Stober, W., et al., "Controlled Growth of Monodisperse Silica Spheres in the Micron Size Range", 1968, vol. 26, pp. 62-69.

* cited by examiner

RUGGEDIZED SOLDER MASK MATERIAL

BACKGROUND

Semiconductor devices, for instance integrated circuits and printed circuit boards, often utilize a solder mask as a top layer of the device. The solder mask separates solder deposits on the devices based on a design of the device. The solder mask protects the covered portions of the device, as solder will not wet or adhere to the solder mask. As these devices develop, power delivery features are more frequently near the top and/or bottom surface of the devices, rather than buried in the device. The solder mask is sometimes the only barrier remaining between an external device and the power delivery feature of the semiconductor device.

SUMMARY

Shortcomings of the prior art are overcome and additional advantages are provided through the provision of a solder mask formulation. The solder mask formulation includes a liquid photo imagable solution. The solder mask formulation additionally includes a solution of functionalized diamondoids.

In a particular aspect, a solder mask formulation is provided that includes a photoinitiator representing approximately 0% to approximately 30% by weight of the solder mask formulation, a functionalized diamondoid solution representing approximately 10% to approximately 50% by weight of the solder mask formulation, an ether representing approximately 10% to approximately 30% by weight of the solder mask formulation, an aromatic representing approximately 0% to approximately 10% by weight of the solder mask formulation, a sulfate representing approximately 10% to approximately 30% by weight of the solder mask formulation, an acetate representing approximately 0% to approximately 10% by weight of the solder mask formulation, and one or more acrylates each representing approximately 1% to approximately 30% by weight of the solder mask formulation.

Further, a semiconductor fabrication method is provided. The semiconductor fabrication method includes applying a solder mask formulation to a semiconductor device. The solder mask formulation includes a liquid photo imagable solution. The solder mask formulation additionally includes a solution of functionalized diamondoids.

Additional features and advantages are realized through the concepts described herein.

BRIEF DESCRIPTION OF THE DRAWINGS

Aspects described herein are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Disclosed herein is a solder mask formulation which has been ruggedized by incorporating nanoparticles, thereby improving mechanical toughness and chemical resistance of a solder mask formed using the formulation. Conventional solder masks are designed solely to separate solder deposits based upon the design of a semiconductor device, as solder will neither wet nor adhere to the solder mask. However, as the power features of semiconductor devices become near the top and/or bottom surface of semiconductor devices, conventional solder masks present issues. For instance, many solder masks are soft and thus easily displaced or damaged with little force applied. Additionally, some conventional solder masks may be porous, which can result in material leaching through or into the solder mask over time. As the solder mask is sometimes the only barrier layer between power features of a semiconductor device, these properties may not be desirable.

In one embodiment described herein, a solder mask formulation is disclosed which includes, for instance, a liquid photo imagable solution and a solution of nanoparticles. The liquid photo imagable (LPI) solution can include any now known or later developed solution capable of forming a thin layer and polymerizing or crosslinking upon exposure to, e.g., actinic radiation, or short-wavelength light. In particular examples, LPI solutions may include at least one of an epoxy resin, an acrylated epoxy resin, multifunctional acrylates, a dye, and a filler. In general, included materials can be any now known or later developed resins or polymers which are photo-activated, and known dyes and fillers.

For example, the LPI solution includes a photoinitiator, which is known in the art. It may also include an ether, for example, dipropylene glycol monomethyl ether. Further, aromatics, such as solvent naptha heavy aromatics, may be included in the LPI solution. Sulfates, such as barium sulfate, can be included. Additionally, acetates such as diethylene glycol monoethylether acetate may be included in the LPI solution. In some embodiments, acrylates may be included, such as trimethylolpropane triacrylate and di-trimethylolpropanetetra-acrylate. Any other components of LPI solutions should be understood to be included within the scope of LPI solutions as used in this disclosure, as these examples are not intended to be limiting.

In one embodiment, the solution of nanoparticles can include a solution of functionalized diamondoids. Diamondoids are variants of carbon cage molecules. Adamantane is the smallest of the diamondoids, being the smallest unit cage structure of a diamond crystal lattice. Diamondoids on a nanoscale can include adamantine, diamantine, triamantane, isotetramantane, pentamantane, cyclohexamantane, and super-adamantane, as examples. The number of faces, cages, and carbon molecules are not intended to be limiting, as any of various diamondoids of varying sizes can be utilized. In particular examples, the diamondoid utilized is between approximately 1 nanometer (nm) and approximately 50 microns.

Figure 1:
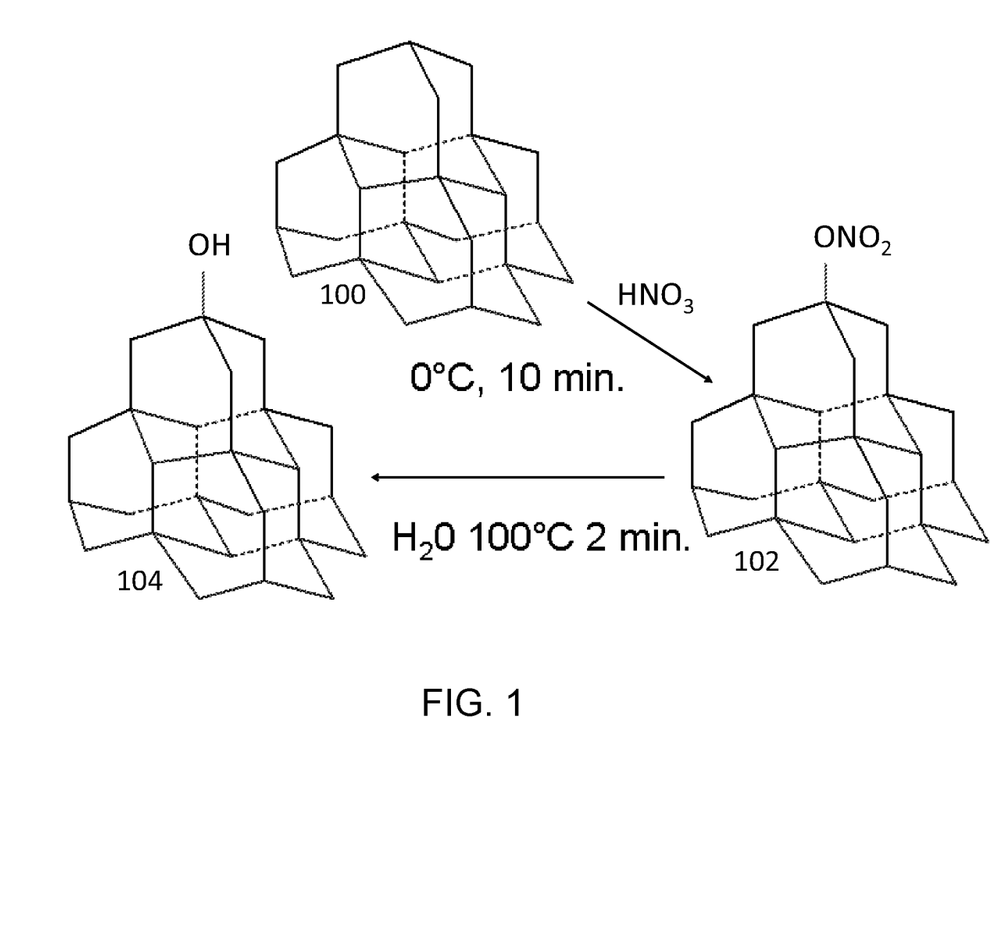
FIG. 1 depicts an example diamondoid reaction scheme, according to aspects described herein.

In one embodiment as illustrated in FIG. 1, a diamondoid such as pentamantane 100, for instance, can be functionalized by nitroxylation of pentamantane molecules with nitric acid, in some embodiments at 0° C. for 10 minutes, forming an apical nitrate intermediate 102. The apical nitrate 102 of pentamantane can then be hydrolysed to an apical alcohol 104. For instance, the apical nitrate may be hydrolised in the presence of water and heated to 100° C. for approximately two minutes. Although illustrated in FIG. 1 as containing a hydroxyl on the apical (top) position, it should be understood that the medial (base) position or other structures may be utilized. The hydroxyl group is easily displaced when reacted with a functional ligand, which can include acrylate moieties and ether moieties. In some embodiments, the apical alcohol 104 may be reacted with an acid chloride to yield an acrylate-functionalized diamondoid, such as a diacrylate-functionalized diamondoid, or an ether-functionalized diamondoid. Thus, the diamondoid can include multifunctional acrylate or epoxy functionality, depending upon the photoresist used in the LPI solution.

Figure 2:
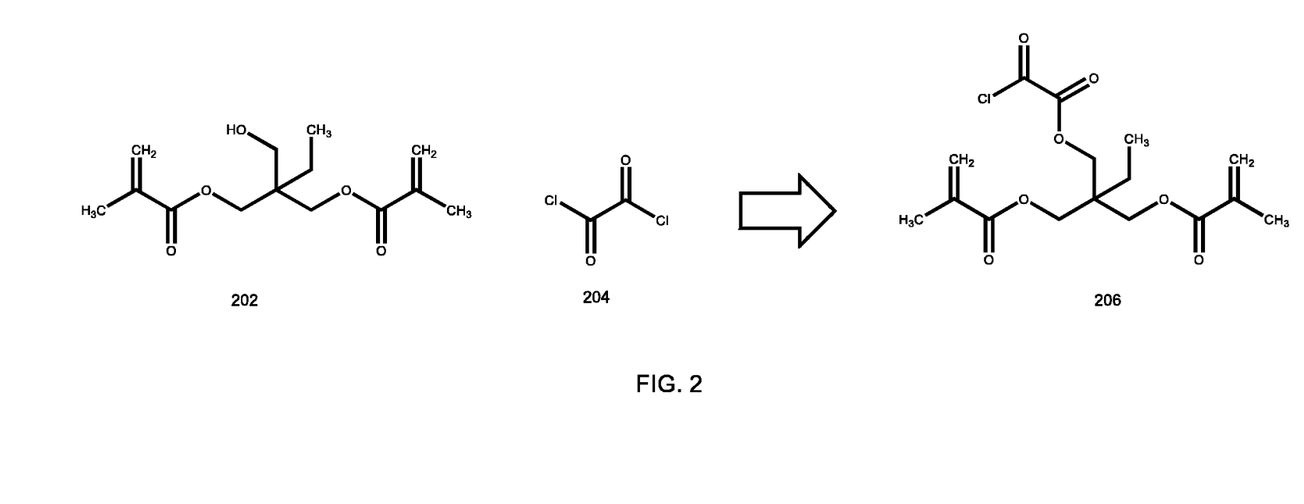
FIG. 2 depicts a reaction scheme for preparing a moiety for attaching to the diamondoid, according to aspects described herein.
Figure 3:
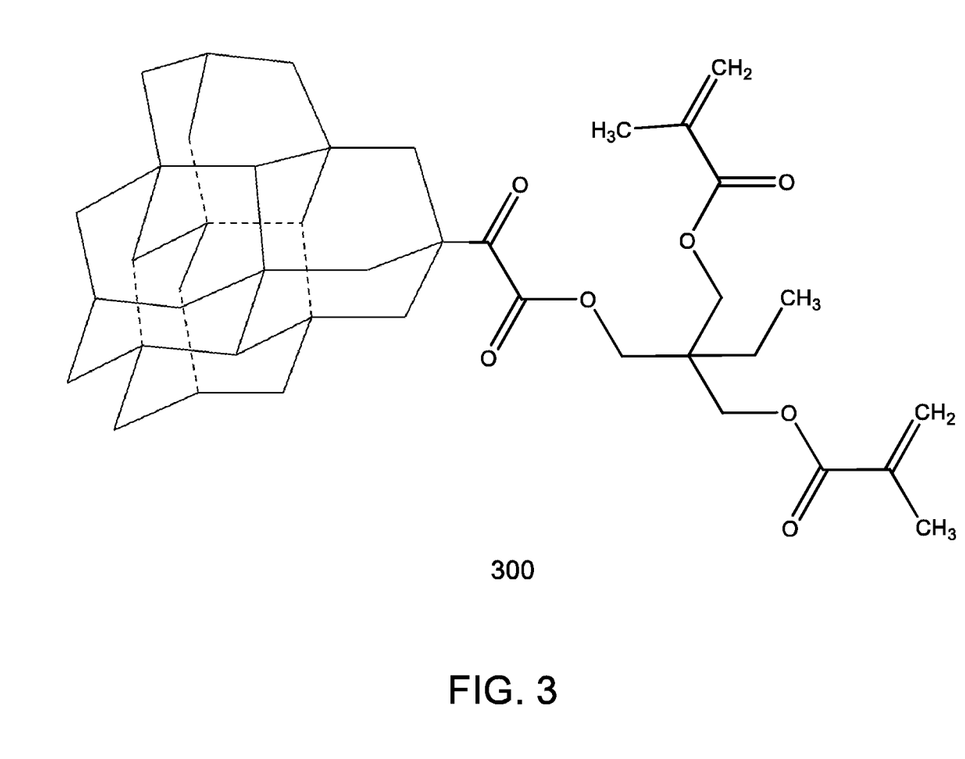
FIG. 3 depicts a functionalized diamondoid, according to aspects described herein.

In one embodiment, illustrated in FIG. 2, trimethyolpropane diacrylate 202 can be reacted with oxalyl chloride 204 to yield an acid chloride 206, which can react with the apical alcohol 104 (FIG. 1) to displace the hydroxyl and yield a diacrylate-functionalized diamondoid 300, such as that shown in FIG. 3. Though FIG. 3 presents the utilization of trimethyolpropane diacrylate, it should be understood that any acrylate capable of crosslinking upon exposure to actinic radiation may be utilized. Additionally, similar approaches may be used to prepare an ether, in some embodiments trimethyol diglycidyl ether, which can be reacted with the apical alcohol 104 (FIG. 1) of pentamantane to yield an epoxy functionalized diamondoid 300, replacing the acrylate with an ether moiety.

The functionalized diamondoid 300 can be chosen to match or otherwise complement the acrylate or epoxy used in the LPI, allowing for the functionalized moiety of the diamondoid to crosslink with the resin or epoxy formed by the LPI solution and with other functionalized diamondoids upon exposure to actinic acid. This extensive crosslinking results in the solder mask formulation creating a matrix which can include an interpenetrating polymer network (IPN). This IPN has a higher chemical resistance as compared to traditional solder masks, as well as a higher abrasion resistance. In other words, based on the interpenetrating polymer network, the formulation is configured to have a greater abrasion resistance than the chemical resistance of a formulation (e.g. for instance the same formulation or other formulations) that are absent/without/lacking the solution of functionalized diamondoids. Abrasion and chemical resistances may be gauged based on any desired scale and/or standard, such as any ISO (International Organization for Standardisation) and/or ASTM International standard. Particular examples of such standards include the ISO 2812-1:2007 standard for chemical resistance and the ASTM D4060-14 standard for abrasion resistance.

Conventional solder masks are easily damaged or removed in further processing or use. Embodiments disclosed herein are stronger and more difficult to damage or remove accidentally. For instance, in use, the solder mask formulation, upon curing, can be resistant to damage from inadvertent mechanical contact such as burs, over torque, and tolerance issues, as well as other types of damage. An additional benefit of the solder mask formulation is that it is more resistant to chemical leaching than conventional solder masks. Chemical leaching from unreacted fluxes, sulfonated cleaners, bias, humidity, and other solvents and solutions is more likely to be resisted in some embodiments. The decreased porosity of the solder mask is partially a result of the increased crosslinking.

The increase in chemical resistance, abrasion resistance, and resistance to chemical leaching are due in part to the IPN of crosslinked ligands and resin or epoxy forming a solid network. The cage structure and strength of the diamondoids also contributes to these properties. Diamondoids are strong and stiff structures which form a three-dimensional network of covalent bonds, and, when connected together throughout the IPN, contribute an extra strength when compared to conventional solder masks. This contributes especially to the abrasion resistance.

In some embodiments, the functionalized diamondoids represent between approximately 10% and approximately 50% by weight of the solder mask formulation, with the LPI solution making up the difference. One advantage of the functionalized diamondoids is that their small size allow them to be added directly to the LPI solution. In some embodiments, methods described herein to apply the solder mask formulation may be the same as those used in applying conventional solder masks, i.e. those without the functionalized diamondoids. For instance, a solder mask formulation described herein may be silkscreened or sprayed-on using any of various techniques, and absent/without alteration after adding the solution of functionalized diamondoids (i.e. no alteration is necessary after adding the solution of functionalized diamondoids). The curing of the mask using actinic radiation, or photolithography, may also proceed as it does currently or conventionally, as the moieties on the diamondoids and the matrix itself of the LPI solution will crosslink under the same or similar conditions. In some embodiments, the LPI solution and functionalized diamondoids are ultraviolet (UV) light curable.

In one example embodiment, the solder mask formulation can include a photoinitiator representing approximately 0% to approximately 30% by weight of the solder mask formulation; a functionalized diamondoid solution representing approximately 10% to approximately 50% by weight of the solder mask formulation; an ether representing approximately 10% to approximately 30% by weight of the solder mask formulation; an aromatic representing approximately 0% to approximately 10% by weight of the solder mask formulation; a sulfate representing approximately 10% to approximately 30% by weight of the solder mask formulation; an acetate representing approximately 0% to approximately 10% by weight of the solder mask formulation; and one or more acrylates each representing approximately 1% to approximately 30% by weight of the solder mask formulation.

Figure 4A:
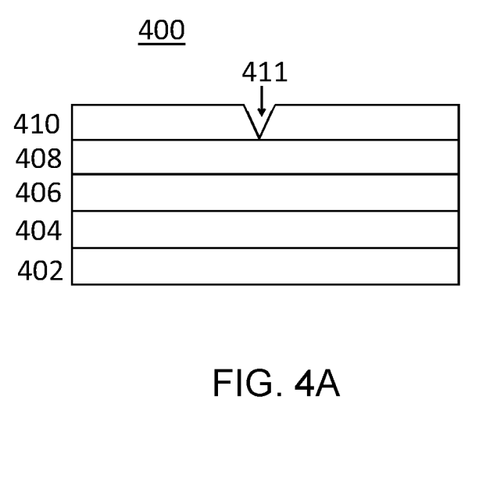
FIG. 4A depicts a side view of a semiconductor device with a solder mask.
Figure 4B:
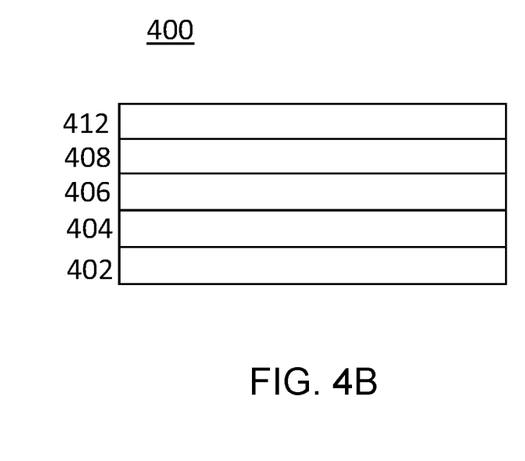
FIG. 4B depicts a side view of a semiconductor device with a solder mask, according to aspects described herein.

In accordance with additional aspects described herein, a semiconductor fabrication method is disclosed. As shown in FIGS. 4A and 4B, a semiconductor device 400 can include, for instance, a printed circuit board (PCB), only the top few layers of which are shown in FIGS. 4A and 4B). In FIG. 4A, a mask 402, a core layer 404, a laminate layer 406, and a surface copper foil 408 are shown. The surface copper foil 408 can include power features in some embodiments, such as a 12V power feature. Additionally, ground features may be included in core layer 404. FIG. 4A shows a solder mask formulation 410 that has been applied but is easily damaged as indicated by the divot 411 in layer 410. As an alternative, and as disclosed in accordance with aspects presented herein, a method includes applying to a semiconductor device a solder mask formulation as described herein. As shown in FIG. 4B, the semiconductor device 400 includes a solder mask formulation having an LPI solution and a solution of functionalized diamondoids as described above. The solder mask layer 412 resulting from this method is stronger and less prone to damage than a conventional solder mask. Additionally, it is more chemical resistant and leaching resistant due to the increased polymer crosslinking resulting from the moieties on the functionalized diamondoids crosslinking with one another and the LPI solution.

Conventional solder masks can be damaged, which can lead to problems such as power shorts or ground shorts. Additionally or alternatively, the devices can smoke or burn and have partial or total failures. However, solder mask formulations described herein may be more resistant to cuts, scrapes, compressive impingement, and other mechanical damage, as well as more resistant to leaching of flux residue and other solvents used in semiconductor device assembly or fabrication more generally. Thus, the power features, such as PCB surface power, is protected from ground shorts. Further protection is provided from mechanical contact of external components coming into contact with the device. Tolerance and fabrication defects are protected against defects that include but are not limited to burs, overcuts, undercuts, grooves, and other defects, as examples. Additionally, inadvertent manufacturing assembly errors can be reduced in terms of the damage they cause to the device. Examples of such errors include bent assembly pins, over torqueing of screws, and more generally any handling damage. The stronger solder mask 412 can be applicable to any desired components, for instance (but not limited to) central processing unit (CPU) socket heat sink load frames, compliant pin connectors, bus bars, plastic encapsulated microcircuits (PEMs), pans, and bezels, as examples.

Additionally or alternatively Janus particles may be used in combination with a LPI solution as described in the above embodiments, for instance instead of using functionalized diamondoids as described herein. Aspects described above may apply to such approaches that use Janus particles, except that the diamondoids may be replaced with Janus particles. It is understood that Janus particles are nanoparticles, and in some embodiments can be between approximately 10 nm to approximately 5 microns for purposes of a solder mask formulation according to some embodiments. Janus particles are unique in that they can be functionalized differently on each of two sides. It should be understood that the Janus particle can be functionalized the same throughout, or with two or more different types of moieties. In some embodiments, a Janus particle can include a silica microparticle or silica nanoparticle.

Figure 5:
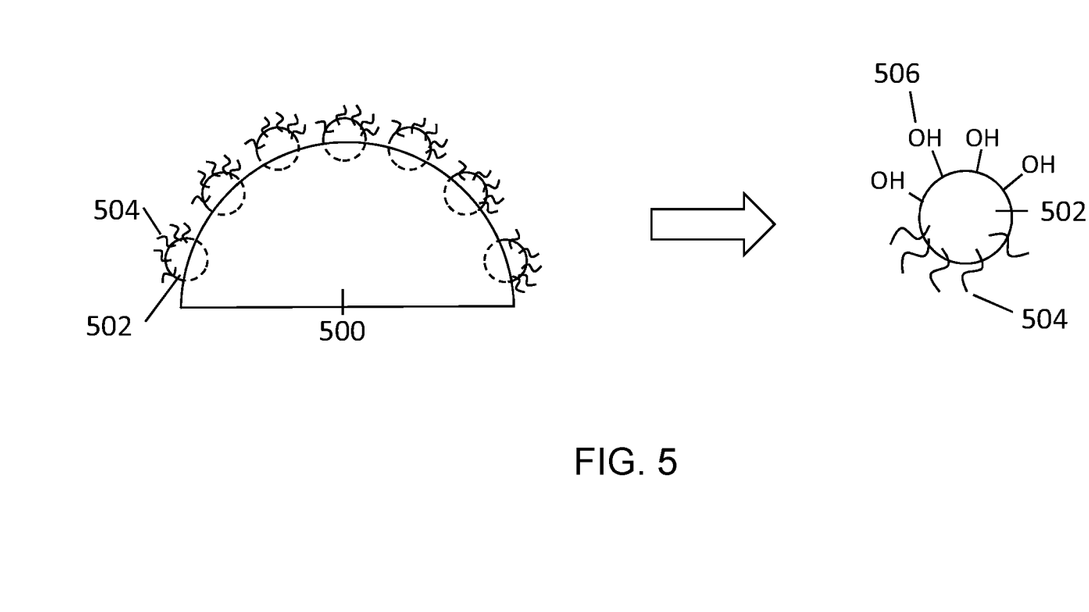
FIG. 5 depicts a functionalized Janus particle within and out of a wax droplet, according to aspects described herein.

Any approach, now known or later developed, of preparing silica nanoparticles may be utilized. Often, the water concentration during synthesis can be varied to control the size of the desired Janus particle. Once synthesized, Janus particles can be placed in an emulsion to functionalize them selectively. In some embodiments, the Janus particles may first be mixed with a low concentration of cetyl trimethylammonium (CTAB) in order to partially hydrophobize the surface and avoid forming a bilayer on the surface of the particle. CTAB can also help the Janus particles favor the adsorption at the oil-water interface. Wax, such as paraffin wax, can then be added to the solution of Janus particles, which has been warmed to melt the wax. As seen in FIG. 5, after cooling, the wax solidifies into droplets 500 with Janus particles 502 partially extruding from the surface of the droplets (a partial droplet 500 being shown in FIG. 5). The Janus particles 502 have been further functionalized with moieties 504. These moieties 504 can include any of the above moieties and similar reaction chemistry. In some embodiments, the moieties 504 may include vinyl or epoxy moieties, including but not limited to amines, allyls, and acrylates. In one embodiment, vinyl chloride or epichlorohydrin may be reacted with the exposed surface of Janus particles 102, resulting in ligands 504, which are functionalized ligands for crosslinking or bonding with resins or epoxies.

Once functionalized, the Janus particles 502 can be removed from the wax, using, in some embodiments, a hydrocarbon solvent, such as benzene. Centrifugation and decanting can be used to remove any residual wax. Upon cleaning, the second side of the Janus particles may be functionalized with a moiety 506. In some embodiments, this could be the same ligand if desired, or a different crosslinking moiety that will crosslink with itself rather than the resin or epoxy used. Additionally, in some further embodiments, the diamondoids disclosed above may be connected to the other side of the Janus particles 502. As illustrated in FIG. 5, moiety 506 includes hydroxyl groups, which may be the residual group from synthesis. In embodiments utilizing the hydroxyl group, the resin and other Janus particles may bond to exposed hydroxyl groups 506 of the Janus particles 502, resulting in a similar IPN as in the diamondoid embodiments. However the characteristics of the IPN will be different based upon the characteristics of silica nanoparticles that make up the Janus particles 504 as compared to the diamondoids.

The Janus particles 504, in some embodiments, are small enough to also be directly mixed into the LPI solution. Thus, as disclosed above, a solder mask formulation can include approximately 10% to approximately 50% by weight of functionalized Janus particles, with the remaining percent including LPI solution. In one example, a solder mask formulation includes, by weight, 10-30% precipitated silica, 0-10% photoinitiator, 10-50% functionalized Janus particles, 10-30% dipropylene glycol monomethyl ether, 0-10% solvent naphtha (petroleum) heavy aromatic, 10-30% barium sulfate, 0-10% diethylene glycol monoethylether acetate, 1-5% trimethylolpropane triacrylate, and 10-30% di-trimethylolpropanetetra-acrylate. With the addition of some precipitated silica, the examples and proportions of LPI solutions and solder mask formulations described above in relation to the diamondoids are incorporated herein.

Although various examples are provided, variations are possible without departing from a spirit of the claimed aspects.

Although various embodiments are described above, these are only examples.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A solder mask formulation, comprising:
   a liquid photo imagable solution; and
   a solution of functionalized diamondoids, wherein a size of a diamondoid moiety of a functionalized diamondoid of the solution of functionalized diamondoids is between approximately 1 nanometer (nm) and approximately 50 microns.

2. The solder mask formulation of claim 1, wherein the functionalized diamondoid has an acrylate moiety attached thereto, wherein the acrylate includes a diacrylate, and wherein the diacrylate includes trimethylolpropane diacrylate.

3. The solder mask formulation of claim 1, wherein the functionalized diamondoids include a diamondoid having an ether moiety attached thereto.

4. The solder mask formulation of claim 3, wherein the ether includes trimethylolpropane diglycidyl ether.

5. The solder mask formulation of claim 1, wherein the functionalized diamondoids are configured to crosslink with a resin formed by the liquid photo imagable solution and other functionalized diamondoids upon exposure to actinic radiation, and wherein a matrix resulting from the crosslinking includes an interpenetrating polymer network.

6. The solder mask formulation of claim 5, wherein the formulation is configured to have a greater chemical resistance based on the interpenetrating polymer network than a chemical resistance of a formulation that lacks the solution of functionalized diamondoids.

7. The solder mask formulation of claim 5, wherein the formulation is configured to have a greater abrasion resistance based on the interpenetrating polymer network than a chemical resistance of a formulation that lacks the solution of functionalized diamondoids.

8. The solder mask formulation of claim 1, wherein the functionalized diamondoids represent between approximately 10% and approximately 50% by weight of the solder mask formulation.

9. A solder mask formulation comprising:
   a photoinitiator representing approximately 0% to approximately 30% by weight of the solder mask formulation;
   a functionalized diamondoid solution representing approximately 10% to approximately 50% by weight of the solder mask formulation, wherein a size of a diamondoid moiety of a functionalized diamondoid of the functionalized diamondoid solution is between approximately 1 nanometer (nm) and approximately 50 microns;
   an ether representing approximately 10% to approximately 30% by weight of the solder mask formulation;
   an aromatic representing approximately 0% to approximately 10% by weight of the solder mask formulation;
   a sulfate representing approximately 10% to approximately 30% by weight of the solder mask formulation;
   an acetate representing approximately 0% to approximately 10% by weight of the solder mask formulation; and
   one or more acrylates each representing approximately 1% to approximately 30% by weight of the solder mask formulation.

10. The solder mask formulation of claim 9, wherein the functionalized diamondoid has an acrylate moiety attached thereto, wherein the acrylate includes a diacrylate, and wherein the diacrylate includes trimethylolpropane diacrylate.

11. The solder mask formulation of claim 9, wherein the functionalized diamondoids are configured to crosslink with a resin formed by the liquid photo imagable solution and other functionalized diamondoids upon exposure to actinic radiation, and wherein a matrix resulting from the crosslinking includes an interpenetrating polymer network.

12. The solder mask formulation of claim 11, wherein the formulation is configured to have a greater chemical resistance based on the interpenetrating polymer network than a chemical resistance of a formulation that lacks the solution of functionalized diamondoids.

13. The solder mask formulation of claim 11, wherein the formulation is configured to have a greater abrasion resistance based on the interpenetrating polymer network than a chemical resistance of a formulation that lacks the solution of functionalized diamondoids.

14. A semiconductor fabrication method comprising:
   applying a solder mask formulation to a semiconductor device, the solder mask formulation comprising:
      a liquid photo imagable solution; and
      a solution of functionalized diamondoid, wherein a size of a diamondoid moiety of a functionalized diamondoid of the functionalized diamondoid solution is between approximately 1 nanometer (nm) and approximately 50 microns.

15. The semiconductor fabrication method of claim 14, wherein the functionalized diamondoids include a diamondoid having an ether moiety attached thereto.

16. The semiconductor fabrication method of claim 15, wherein the ether includes trimethylolpropane diglycidyl ether.

17. The semiconductor fabrication method of claim 14, wherein the functionalized diamondoids are configured to crosslink with a resin formed by the liquid photo imagable solution and other functionalized diamondoids upon exposure to actinic radiation, and wherein a matrix resulting from the crosslinking includes an interpenetrating polymer network.

18. The semiconductor fabrication method of claim 17, wherein the formulation is configured to have a greater chemical resistance based on the interpenetrating polymer network than a chemical resistance of a formulation that lacks the solution of functionalized diamondoids.

19. The semiconductor fabrication method of claim 17, wherein the formulation is configured to have a greater abrasion resistance based on the interpenetrating polymer network than a chemical resistance of a formulation that lacks the solution of functionalized diamondoids.

20. The semiconductor fabrication method of claim 14, wherein the functionalized diamondoids represent between approximately 10% and approximately 50% by weight of the solder mask formulation.

* * * * *